(12) United States Patent
Liao et al.

(10) Patent No.: US 8,643,155 B2
(45) Date of Patent: Feb. 4, 2014

(54) LIQUID CRYSTAL DISPLAY AND CHIP ON FILM THEREOF

(75) Inventors: Liang-Chan Liao, Shenzhen (CN); Po-Shen Lin, Shenzhen (CN); Yu Wu, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 0 days.

(21) Appl. No.: 13/379,640

(22) PCT Filed: Aug. 31, 2011

(86) PCT No.: PCT/CN2011/079166
§ 371 (c)(1),
(2), (4) Date: Dec. 20, 2011

(87) PCT Pub. No.: WO2012/167514
PCT Pub. Date: Dec. 13, 2012

(65) Prior Publication Data
US 2012/0313116 A1 Dec. 13, 2012

(51) Int. Cl.
*H01L 23/34* (2006.01)
*H01L 23/495* (2006.01)

(52) U.S. Cl.
USPC ............. 257/668; 257/88; 257/671; 257/688; 257/E21.499; 257/E23.065; 257/E23.067; 257/E21.079

(58) Field of Classification Search
USPC .................... 257/88, 668, 671, 688, E21.499, 257/E23.065, E23.067, E23.079
See application file for complete search history.

(56) References Cited

U.S. PATENT DOCUMENTS

| | | | |
|---|---|---|---|
| 7,339,262 B2 * | 3/2008 | Son et al. | 257/671 |
| 8,222,089 B2 * | 7/2012 | Choi et al. | 438/123 |
| 2004/0004823 A1 * | 1/2004 | Sakata et al. | 361/795 |
| 2011/0169148 A1 * | 7/2011 | Kim | 257/668 |
| 2011/0304991 A1 * | 12/2011 | Huang et al. | 361/719 |
| 2012/0273928 A1 * | 11/2012 | Kim | 257/668 |
| 2012/0306047 A1 * | 12/2012 | Liao et al. | 257/506 |

* cited by examiner

*Primary Examiner* — Dao H Nguyen
(74) *Attorney, Agent, or Firm* — Cheng-Ju Chiang

(57) ABSTRACT

A chip on film (COF) is disclosed in the present disclosure, which comprises an adhesive base layer, a driving integrated circuit (IC), an adhesive layer and a copper layer. The driving IC is embedded on a surface of the adhesive base layer; the adhesive layer is located under the adhesive base layer; the copper layer is located under the adhesive layer. The adhesive base layer is formed with a heat and pressure spreading structure. A heat and pressure spreading structure is disposed on the adhesive base layer of the COF so that deformation or unevenness of the glass substrate in the bonded area can be avoided when the COF is thermally pressed to the glass substrate of the LCD. These guarantees the consistency between the bonded area and the unbounded area, the bonded area and the unbounded area of the glass substrate will have the same transmissivity and luminance.

2 Claims, 2 Drawing Sheets

LIQUID CRYSTAL DISPLAY AND CHIP ON FILM THEREOF

FIELD OF THE INVENTION

The present disclosure generally relates to the technical field of microelectronics, and more particularly, to a liquid crystal display (LCD) and a chip on film (COF) thereof.

BACKGROUND OF THE INVENTION

Nowadays, liquid crystal displays (LCDs) are generally packaged by using the chip on film (COF) packaging technology because the LCDs must be made to have high resolution and flatness and a narrow screen frame. The COF is the carrier package that joins the chip and the flexible circuit board.

Referring to FIG. 1 and FIG. 2 together, a COF 100 comprises a main body area 110, an input pin side 120 and an output pin side 130. The main body area 110 has a driving integrated circuit (IC) 112 disposed thereon. The COF 100 comprises an adhesive base layer 140, an adhesive layer 150, a copper layer 160 and a green paint layer 170 in sequence. The adhesive base layer 140 is located under the driving IC 112; the adhesive layer 150 is located under the adhesive base layer 140; the copper layer 160 is located under the adhesive layer 150; and the green paint layer 170 is located under the copper layer 160.

When the COF 100 is thermally pressed to a glass substrate (not shown) of the LCD, it is likely that a portion of the glass substrate in the bonded area becomes deformed or uneven relative to other portions of the glass substrate outside the bonded area due to the heat and pressure. This leads to a difference in transmissivity between the bonded area and the unbounded area of the glass substrate and, consequently, a difference in luminance presented by the LCD, which will adversely affect performance of the LCD.

SUMMARY OF THE INVENTION

An objective of the present disclosure is to provide a novel COF, which can solve the problem that thermally pressing a COF to a glass substrate of an LCD tends to cause deformation or unevenness of the glass substrate in the bonded area and consequently cause a difference in luminance of the LCD due to a difference in transmissivity of the glass substrate.

To achieve the aforesaid objective, the present disclosure provides a chip on film (COF), comprising:
  an adhesive base layer;
  a driving integrated circuit (IC), which is embedded on a surface of the adhesive base layer;
  an adhesive layer, being located under the adhesive base layer; and
  a copper layer, being located under the adhesive layer,
  wherein the adhesive base layer is formed with a spreading structure which is used to release heat and pressure.

According to a preferred embodiment of the present disclosure, the spreading structure is a groove, which has an end connected with the ambient.

According to a preferred embodiment of the present disclosure, the groove is a wavy groove, a curved groove, a polygonal groove or a mesh-like groove.

According to a preferred embodiment of the present disclosure, the COF comprises an input pin side and an output pin side, and the groove is disposed on the adhesive base layer at the output pin side.

To achieve the aforesaid objective, the present disclosure further provides an LCD, which comprises a glass substrate and a COF that is packaged together with the glass substrate through tape automated bonding (TAB), the COF comprising:
  a driving IC;
  an adhesive base layer, being located under the driving IC;
  an adhesive layer, being located under the adhesive base layer; and
  a copper layer, being located under the adhesive layer,
  wherein the adhesive base layer is formed with a heat and pressure spreading structure.

The present disclosure has the following benefits, as compared to the prior art, the COF of the present disclosure has a heat and pressure spreading structure disposed on the adhesive base layer so that deformation or unevenness of the glass substrate in the bonded area can be avoided when the COF is thermally pressed to the glass substrate of the LCD. These guarantees the consistency between the bonded area and the unbounded area, the bonded area and the unbounded area of the glass substrate will have the same transmissivity and luminance.

DETAILED DESCRIPTION OF THE INVENTION

The present disclosure will be described in detail hereinbelow with reference to the attached drawings and embodiments thereof.

Figure 1:
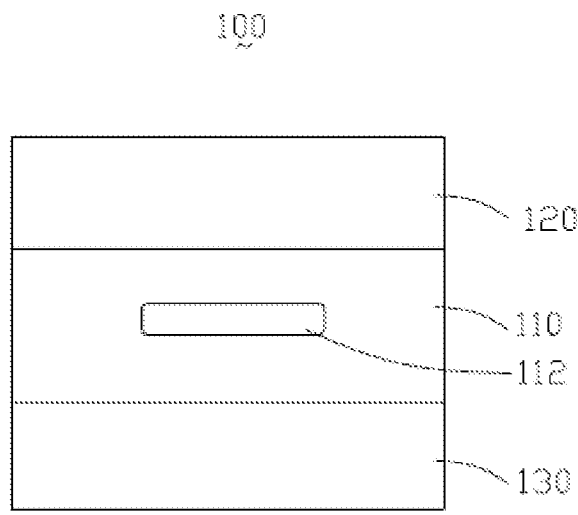
FIG. 1 is a schematic structural top view of a COF in the prior art.
Figure 2:
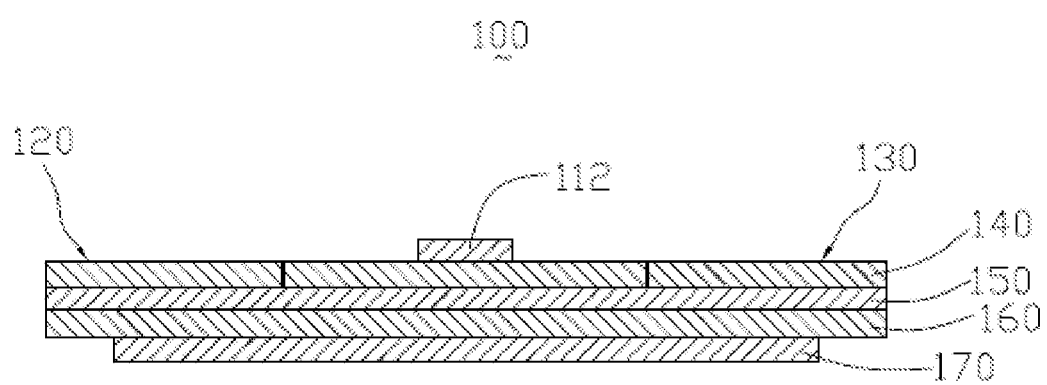
FIG. 2 is a schematic cross-sectional structural view of the COF shown in FIG. 1.
Figure 3:
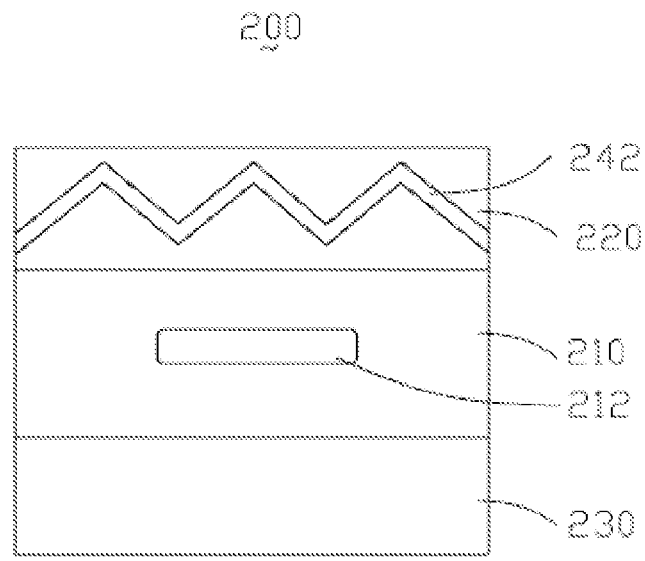
FIG. 3 is a schematic structural top view of a preferred embodiment of a COF according to the present disclosure.

Referring to FIG. 3, the present disclosure provides a COF 200, which comprises a main body area 210, an output pin side 220 and an input pin side 230. The main body area 210 has a driving integrated circuit 212 disposed thereon.

Figure 4:
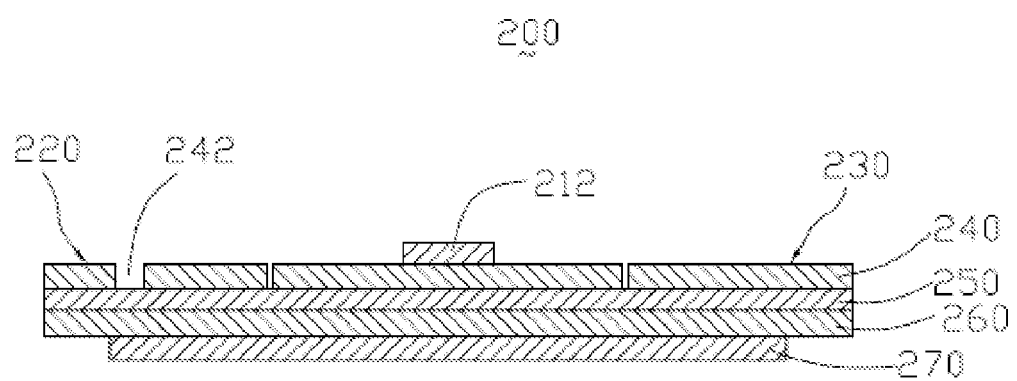
FIG. 4 is a schematic cross-sectional structural view of the COF shown in FIG. 3.

Referring to FIG. 4 together, the COF 200 comprises an adhesive base layer 240, an adhesive layer 250, a copper layer 260 and a green paint layer 270 in sequence.

The driving IC 212 is embedded on a surface of the adhesive base layer 240; the adhesive layer 250 is located under the adhesive base layer 240; the copper layer 260 is located under the adhesive layer 250; and the green paint layer 270 is located under the copper layer 260.

The adhesive base layer 240 at the output pin side 220 is formed with a heat and pressure spreading structure 242. In this embodiment, the heat and pressure spreading structure 242 is a groove, which has an end connected with the ambient. The groove may be a wavy groove, a curved groove, a polygonal groove or a mesh-like groove, but this is not intended to limit present disclosure.

Because the adhesive base layer 240 is formed with the heat and pressure spreading structure 242, the heat and pressure can be spread in various directions via the heat and pressure spreading structure 242 when the COF 200 is thermally pressed to the glass substrate (not shown) of the LCD, without causing deformation or unevenness of the glass substrate in the bonded area. These guarantees the consistency between the bonded area and the unbounded area, the bonded area and the unbounded area of the glass substrate will have the same transmissivity and luminance.

In the prior art, in order to prevent damage of the COF, the COF is provided with a mesh-like groove on the whole main body area thereof. However, this is different from disposing the spreading structure 242 on the adhesive base layer 240 at the output pin side 220 according to the present disclosure. The spreading structure 242 of the present disclosure changes the area of the COF 200 to a small extent, is simple to fabricate and has the function of spreading both heat and pressure.

It is worth noting that, the conductor electrically connected to the glass substrate of the LCD is disposed in the copper layer 260, so the spreading structure 242 has no effect on the circuits at all.

As will be readily understood by those skilled in the art according to the above descriptions, the COF of the present disclosure has a spreading structure disposed on the adhesive base layer, so that deformation or unevenness of the glass substrate in the bonded area can be avoided when the COF is thermally pressed to the glass substrate of the LCD. These guarantees the consistency between the bonded area and the unbounded area, the bonded area and the unbounded area of the glass substrate will have the same transmissivity and luminance.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A chip on film (COF), comprising:
   a driving integrated circuit (IC);
   an adhesive base layer, being located under the driving IC;
   an adhesive layer, being located under the adhesive base layer; and
   a copper layer, being located under the adhesive layer;
   wherein the adhesive base layer is formed with a heat and pressure spreading structure, the COF comprises a main body area, an output pin side and an input pin side, and the heat and pressure spreading structure is disposed on the adhesive base layer at the output pin side, the heat and pressure spreading structure is a wavy groove, which has an end connected with the ambient.

2. A liquid crystal display (LCD), comprising a glass substrate and a chip on film (COF) that is packaged together with the glass substrate through tape automated bonding (TAB), the COF comprising:
   a driving integrated circuit (IC);
   an adhesive base layer, being located under the driving IC;
   an adhesive layer, being located under the adhesive base layer; and
   a copper layer, being located under the adhesive layer;
   wherein the adhesive base layer is formed with a heat and pressure spreading structure, the COF comprises a main body area, an output pin side and an input pin side, and the heat and pressure spreading structure is disposed on the adhesive base layer at the output pin side, the heat and pressure spreading structure is a wavy groove, which has an end connected with the ambient.

\* \* \* \* \*